United States Patent
Boutros et al.

(10) Patent No.: US 7,151,307 B2
(45) Date of Patent: Dec. 19, 2006

(54) INTEGRATED SEMICONDUCTOR CIRCUITS ON PHOTO-ACTIVE GERMANIUM SUBSTRATES

(75) Inventors: Karim S. Boutros, Moorpark, CA (US); Nasser H. Karam, Northridge, CA (US); Dimitri D. Krut, Encino, CA (US); Moran Haddad, Winnetka, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/718,426

(22) Filed: Nov. 20, 2003

(65) Prior Publication Data

US 2005/0110041 A1 May 26, 2005

Related U.S. Application Data

(63) Continuation-in-part of application No. 09/850,773, filed on May 8, 2001.

(51) Int. Cl.
*H01L 31/0328* (2006.01)
*H01L 31/117* (2006.01)

(52) U.S. Cl. ............... 257/616; 257/189; 257/201; 257/613

(58) Field of Classification Search ........... 257/183, 257/184, 187, 189, 197, 200, 201, 613, 616; 438/752, 933, 966
See application file for complete search history.

(56) References Cited

U.S. PATENT DOCUMENTS

| 4,332,974 A | 6/1982 | Fraas |
| 4,385,198 A | 5/1983 | Rahilly |
| 4,872,046 A | 10/1989 | Morkoc et al. |
| 4,997,491 A | 3/1991 | Hokuyo et al. |
| 5,407,491 A | 4/1995 | Freundlich et al. |
| 6,380,601 B1 * | 4/2002 | Ermer et al. ............... 257/440 |
| 2002/0040727 A1 * | 4/2002 | Stan et al. ............... 136/255 |
| 2004/0084694 A1 * | 5/2004 | Fatemi et al. ............... 257/200 |

* cited by examiner

*Primary Examiner*—Eddie Lee
*Assistant Examiner*—Colleen Matthews
(74) *Attorney, Agent, or Firm*—Ostrager Chong Flaherty & Broitman P.C.

(57) ABSTRACT

A semiconductor device having at least one layer of a group III–V semiconductor material epitaxially deposited on a group III–V nucleation layer adjacent to a germanium substrate. By introducing electrical contacts on one or more layers of the semiconductor device, various optoelectronic and microelectronic circuits may be formed on the semiconductor device having similar quality to conventional group III–V substrates at a substantial cost savings. Alternatively, an active germanium device layer having electrical contacts may be introduced to a portion of the germanium substrate to form an optoelectronic integrated circuit or a dual optoelectronic and microelectronic device on a germanium substrate depending on whether the electrical contacts are coupled with electrical contacts on the germanium substrate and epitaxial layers, thereby increase the functionality of the semiconductor devices.

8 Claims, 2 Drawing Sheets

INTEGRATED SEMICONDUCTOR CIRCUITS ON PHOTO-ACTIVE GERMANIUM SUBSTRATES

RELATED APPLICATION

The present application is a continuation-in-part (CIP) application of U.S. patent application Ser. No. 09/850,773 filed on May 8, 2001 entitled "Semiconductor Circuits And Devices On Germanium Substrates" which is incorporated by reference herein.

TECHNICAL FIELD

The present invention generally relates to semiconductor devices and, more particularly, semiconductor circuits and devices on germanium substrates with a photoactive junction.

BACKGROUND ART

It is known to use germanium as a substrate material for epitaxial growth of III–V materials. Germanium is a substrate of choice the space solar cell industry for GaAs and GaInP/GaAs substrates. In this application, germanium substrate is used either with an active semiconductor junction inside of the Germanium substrate or without an active junction in Germanium.

Devices that use these III–V materials are typically photonic devices such as solar cells, light emitting diodes ("LEDs"), photo detectors, or electronic devices such as transistors and diodes. To produce such devices, commonly III–V substrates are used for epitaxial growth of high-quality layers that with further chemical and physical processing will constitute these devices. Usually the substrate for the epitaxial growth of high quality epitaxial films has to have lattice matching with the layers that are to form a device.

Metallo-Organic Vapor Phase Epitaxy (MOVPE) is a technique of choice for the formation of many types of epitaxial III–V semiconductor layers. MOVPE is also often know as MOCVD (Metallo-Organic Chemical Vapor Deposition) or OMVPE (Organo-Metallic Vapor Phase Epitaxy).

The existence of intrinsic substrates in the "semi-insulating" form enabled high-frequency operation of these microelectronic and optoelectronic devices. The disadvantage of these intrinsic substrates is their high cost of use and manufacture. These substrates cannot be used to the device formation in the substrate itself. The substrate is inherently passive.

Optoelectronic properties of Germanium have also been combined with III–V devices to produce multifunction solar cells. In this respect, the optical and semiconductor properties of Germanium have been combined with the optical properties of III–V materials to efficiently convert solar energy into electricity. To date, it is believed that this technology has been limited to photovoltaic applications.

One problem with currently available technology is the cost of using a conventional substrate such as GaAs and InP in microelectronic devices. This cost has effectively prevented III–V devices from being used in many different markets and applications.

Another problem with currently available technology is that growth substrates have typically been limited to III–V materials for use as templates to ensure high quality of the epitaxial III–V films.

It would be highly desired to combine the material and electrical properties of germanium, which is a group IV semiconductor, with material and electrical properties of III–V compounds in such a way as to create electronic devices in epitaxialy grown III–V films integrated with optical and electronic devices in germanium.

SUMMARY OF THE INVENTION

It is thus an object of the present invention to create a less expensive and functionally different optoelectronic and microelectronic devices and/or a combination thereof as compared to the presently available technology.

The above object is accomplished by forming a semiconductor device having at least one layer of a group III–V semiconductor material epitaxially deposited on a germanium substrate. During such deposition by MOVPE, the constituent elements of the III–V layer are introduced as dopants onto the germanium substrate, therein forming a semiconductor junction in the substrate, thus making an active germanium device layer.

Further microelectronic processing that includes, but is not limited to, the formation of metal contacts, etching, and photolithography is used to form regions in the III–V semiconductor that acts as diodes, transistors, resistors and/or optical sensors.

Electrical contacts are formed and coupled on the germanium substrate layer and at least one layer of the group III–V semiconductor material to form a combination of optoelectronic and microelectronic device.

Other objects and advantages of the present invention will become apparent upon the following detailed description and appended claims, and upon reference to the accompanying drawings.

BEST MODES FOR CARRYING OUT THE INVENTION

Figure 1:
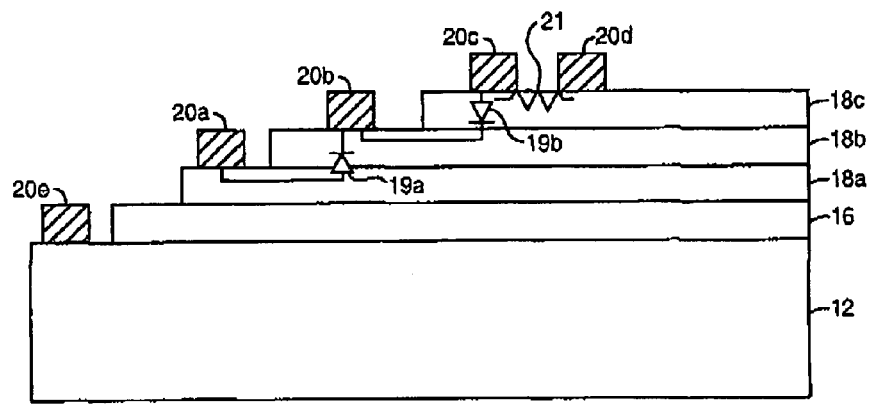
FIG. 1 depicts a semicircuit device according to one preferred. embodiment of the present invention.
Figure 2:
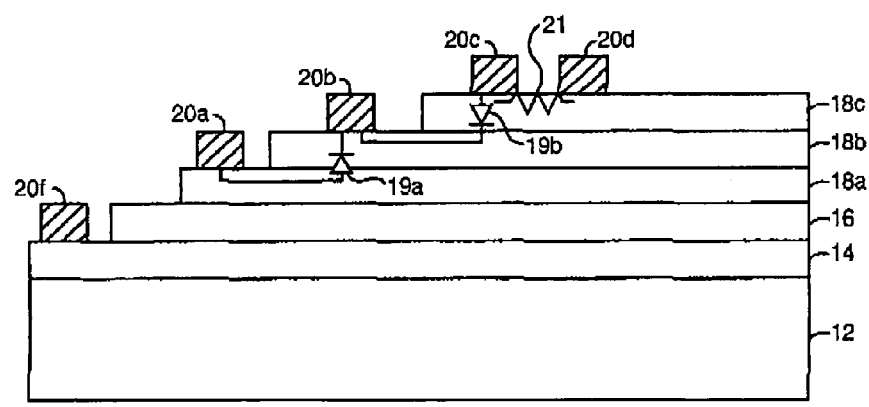
FIG. 2 depicts an optoelectronic integrated circuit according to another preferred embodiment of the present invention.

FIGS. 1 and 2 show schematic representations of forming a semiconductor device 10 that is used to form an optoelectronic integrated circuit that is the heart of the present invention.

Referring now to FIG. 1, a schematic representation of a semiconductor device 10, according to one preferred embodiment is depicted as consisting of a germanium substrate 12, a nucleation layer 16, a series of III–V epitaxial layers 18, and a plurality of electrical contacts 20a, 20b, 20c, 20d, and 20e. In an alternative preferred embodiment, as shown in FIG. 2, a buried germanium diffused-doping active layer 14, is formed on a top portion of the germanium substrate 12 adjacent to the nucleation layer 16 and may include an additional electrical contact 20f.

Preferably, the III–V semiconductor compounds used in the epitaxial layers 18 of the optoelectronic circuits are (Al, In, Ga) arsenide compounds and/or (Al, In, Ga) phosphide compounds that are grown on, germanium substrates 12.

To form the device 10, the germanium substrate 12 is loaded in a metal-organic vapor phase epitaxy ("MOVPE") reaction chamber, where it is subjected to epitaxial layer deposition using convention MOVPE techniques. Alternatively, molecular beam epitaxy ("MBE") may be used to deposit the epitaxial layers. During the step the nucleation layer 16 is deposited. Preferably, the nucleation layer is an InGaP layer that is lattice-matched to the germanium substrate 12. The nucleation layer serves dual functions in this invention. First, the nucleation layer 16 enables the growth of high quality epitaxial layers of III–V materials to form the III–V structures as proposed here. Second, the nucleation layer 16 serves as a diffusion barrier to allow control of dopant diffusion in the germanium substrate 12 to form the buried germanium diffused-doping active layer 14.

By using InGaP as the nucleation layer 16, only a limited amount of phosphorus from the nucleation layer 16 diffuses into the germanium substrate 12. The InGaP nucleation layer also acts as a diffusion barrier for arsenic diffusing from the overlying GaAs layer into the germanium layer 12, when GaAs is used as one or more of the epitaxial layers 18. Thus, a good quality junction is formed in the germanium, permitting the germanium junction to be utilized as a photoactive device.

By flowing the appropriate gases during the MOVPE growth run, doping materials are diffused into the germanium substrate 12 to form the germanium diffused-doping active layer 14. For example, an n-type dopant can be diffused in a p-type germanium substrate to form a p-n junction photodetector device. The doping profile and the number of diffused layers is part of the device 10 structure design and is controlled by the thickness and conductivity type of the III–V nucleation layer 16 and the dopant flux and flux sequence used during the MOVPE growth run.

On top of the nucleation layer 16, III–V semiconductor layers 18 are epitaxially deposited successively to form one or more desired device structures such as transistors (shown as 60 in FIG. 3), resistors and diodes. The number and type (n-type or p-type doping) of epitaxial layers 18 may vary depending upon the application. For example, a heterojunction bipolar transistor structure may have an n-p-n GaAs/GaAs/InGaP epitaxial layer structure. For illustrative purposes. FIGS. 1 and 2 shows three separate devices, including a first diode 19a that is formed by electrically coupling electrical contacts 20a, 20b through layers 18a and 18b; a second diode 19b that is formed by electrically coupling contacts 20b, 20c through layers 18b and 18c; and a resistor 21 that is formed by electrically coupling electrical contacts 20c, 20d through layer 18c.

After the completion of the III–V epitaxial layers 18, the resultant structure, or wafer, is subjected to an etching process using conventional photolithography techniques to expose the germanium active device layer 14 from underneath the III–V epitaxial layers 18.

Next, using conventional photolithography and semiconductor fabrication techniques, electrical contacts 20a, 20b, 20c, 20d, 20e, and 20f are formed to the various layers of the semiconductor device 10. While contacts 20a, 20b, 20c, 20d, 20e, and 20f may be formed on any layers, they are preferably formed on one or more of the Ill–V epitaxial layers 18, the doped germanium active layer 14, and on the back side of the germanium substrate layer 12. Depending upon which layers the electrical contacts 20a, 20b, 20c, 20d, 20e, and 20f in FIGS. 1 and 2 are coupled to, and which electrical contacts 20a, 20b, 20c, 20d, 20e, and 20f are coupled, various preferred embodiments of microelectronic, optoelectronic, and optoelectronic integrated circuits ("OEIC") may be formed. These are described below.

For example, by coupling together some of the electrical contacts 20a, 20b, 20c, 20d, 20e, and 20f of the III–V epitaxial layers 18 which are not intended for photosensitivity, various microelectronic transistors may be produced. Similarly, by coupling together some of the electrical contacts 20, 20a, 20b, 20c, 20d, 20e, and 20f of the light sensitive growth layers, such as the germanium substrate 12, either with or without the non-light sensitive growth layers, optoelectronic, or optically active devices, may be produced. Some examples of optoelectronic devices include the formation of an active germanium-device 14 such as a photodetector, light emitting diode ("LED"), or laser. The use of germanium substrates 12 as a template for these microelectronic and/or optoelectronic devices offers a substantial cost advantage in terms of manufacturing while maintaining the high quality of the III–V epitaxial as compared with traditional substrates such as GaAs and InP.

Further, the combination of two or more device structures described above, also known as monolithic integration, could result in a single device having a microelectronic transistor circuit and an optoelectronic device.

By combining the electrical contacts 20e of the germanium substrate 12 and the electrical contacts 20a, 20b, 20c, or 20d epitaxial layers 18, an optoelectronic or microelectronic device can be formed with high performance and cost effectiveness not previously attainable in either microelectronic or optoelectronic devices using a conventional substrate. By combining electrical contacts 20e of the germanium substrate 12 with the electrical contact 20f germanium substrate active layer 14 and one or more of the electrical contacts 20a, 20b, 20c, or 20d of the epitaxial layers 18, an OEIC can be formed with functionality and high performance not previously attainable in either microelectronic or optoelectronic devices.

The germanium substrate 12 is a key aspect of the invention, as it provides certain optical and electrical properties that are unique and different from III–V semiconductors, such as the bandgap of a semiconductor and electrical mobilities of electrons and holes. These elements and properties of the germanium substrate 12 will enable circuit functionality, such as sensitivity to particular wavelengths for a photodetector, which when combined with circuit functionality of III–V devices will enable performance not possible with the present art using III–V devices exclusively. The substrate doping and type (n or p conductivity type) is an important parameter in the choice of the germanium substrate 12 to achieve the desired device structure. Low level of doping would be preferred to enable high frequency operation of the microelectronic circuit.

In an alternative embodiment (not shown), this buried germanium diffused-doping active layer 14 can be further patterned, where selected regions will be masked form further diffusion to occur, and additional diffusion is performed again to form additional junctions in the germanium substrate 12. In this way, spatial differences in the diffused profile of dopants can exist simultaneously in the same wafer.

Figure 3:
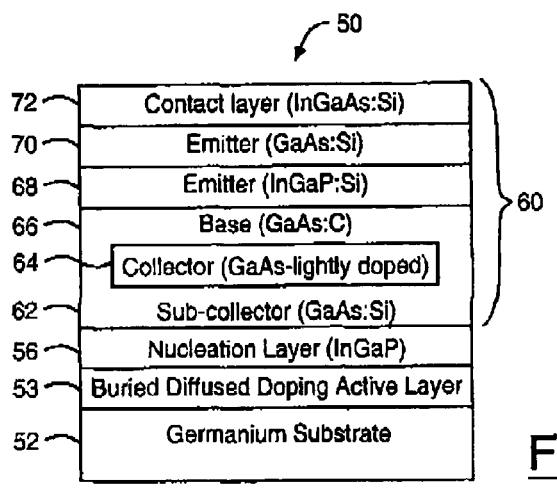
FIG. 3 depicts a specific embodiment of FIG. 1.

Referring now to FIG. 3, an OEIC device 50 according to one preferred embodiment of the present invention is depicted. To form the OEIC device 50, an n-type as well as a p-type germanium substrate 52 were loaded simultaneously in a metal-organic vapor phase epitaxy ("MOVPE")

reaction chamber, where it is subjected to epitaxial layer deposition using conventional MOVPE techniques. The substrate 52 was chosen to be six degrees off the normal crystallographic cut, which insures the optimum quality of the III–V crystals deposited on it. During the step the InGaP nucleation layer 56 is deposited.

By flowing the appropriate gases during the MOVPE growth run, doping materials are diffused through the nucleation layer 56 and a portion of the germanium substrate 52 to form a buried germanium diffused-doping active layer 53. For example, as depicted in FIG. 3, an n-type dopant is diffused into a p-type germanium substrate 52 to form a p-n junction photodetector device. The doping profile and the number of diffused layers is part of the device structure design and is controlled by the thickness of the InGaP nucleation layer 56 and the dopant flux and flux sequence used during the MOVPE growth run.

On top of the nucleation layer 56, III–V semiconductor layers are epitaxially deposited successively to form a typical InGaP/GaAs heterojunction bipolar transistor ("HBT") structure 60. Here, these layers are a GaAs:Si subcollector layer 62, a lightly doped GaAs collector layer 64, a GaAs:C base layer 66, an InGaP:Si emitter layer 68, a GaAs:Si emitter layer 70, and an InGaAs:Si contact layer 72. Following the growth sequence, the layers 62, 64, 66, 68, 70, 72 are fabricated into devices with large area to extract direct current performance of the HBTs.

Figure 4A:
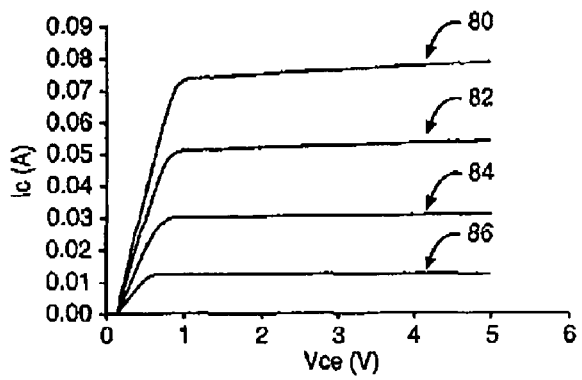
FIG. 4a is an I–V plot of the transistor device of FIG. 3 when it is wired in a common-emitter configuration at four distinct base current levels.
Figure 4B:
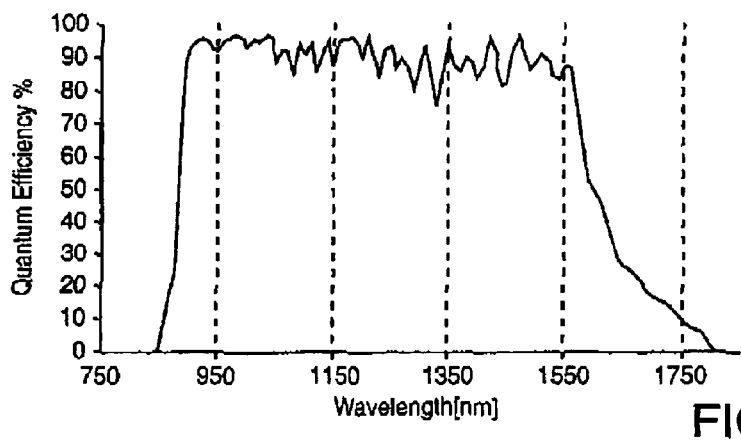
FIG. 4b is a spectral response plot of a transistor device of FIG. 3 having an active germanium junction with an InGaP nucleation layer grown by MOCVD and additional GaAs and other III–V semiconductor layers.

FIGS. 4a and 4b depict the electrical curves describing the performance of an HBT as in FIG. 3. FIG. 4a is an I–V plot of collector current ("Ic") versus common-emitter voltage ("Vce"). FIG. 4b shows a typical quantum efficiency of an active Germanium junction 14 with InGaP nucleation layer 16 grown by MOCVD just above the germanium substrate 12. Each is described below.

FIG. 4a shows the electrical characteristics of a transistor device as depicted in FIG. 3 when it is wired in a common-emitter configuration. Each curve shows the behavior of Ic as a function of the Vce at a particular Ib. For example, plot 80 depicts the behavior of Ic for an Ib of 400 microamps, plot 82 depicts the behavior of Ic for an Ib of 300 microamps plot 84 depicts the behavior of Ic for an Ib of 200 microamps and plot 86 depicts the behavior of Ic for an Ib of 100 microamps. One skilled in the art would recognize that the curves depicted in plots 80, 82, 84 and 86 in FIG. 4a show that the device of FIG. 3 behaves as a typical transistor.

FIG. 4b shows a typical quantum efficiency of an active Germanium junction 14 with InGaP nucleation layer 16 grown by MOCVD just above the germanium substrate 12. Additional GaAs and other III–V layers 18 are grown are also grown above the germanium substrate 12 and the nucleation layer 16.

When compared to equivalent conventional III–V HBT structures deposited on conventional III–V substrates, FIGS. 4a and 4b illustrate graphically that the OEIC device 50 of FIG. 3 showed equivalent performance. This indicates that the use of germanium substrates 52 has resulted in the same high performance as conventional III–V HBT structures.

The numerous advantages of the present invention are centered on the realization of an OEIC combining the properties of germanium as a substrate and as part of an active device, with known advantages of III–V microelectronic/optoelectronic components in high performance circuits.

First, the use of germanium as a substrate for microelectronic integrated circuits offers a significant cost reduction, in the range of two to ten times cheaper, compared to conventional substrates such as GaAs and InP substrates.

Second, the current method for growth of III–V semiconductor layers on germanium substrates produces microelectronic and optoelectronic devices of comparable quality to currently available conventional substrates. Thus, the present invention offers significant cost reduction without a corresponding drop in quality.

Third, by introducing an active germanium device 14 to the germanium substrate 12, an optoelectronic circuit 10 can take advantage not only of the functional properties realized by the III–V circuit, but also of the properties of germanium as a different and distinct material from its III–V substrate counterparts. This advantage is particularly applicable when the germanium active device 14 is a photodetector, which would operate at different wavelengths, not achievable by the III–V semiconductor layers 18 grown on the germanium substrate 12. This enables light detection of signals that would otherwise be difficult to detect effectively if only III–V compound materials were used in the active circuit components.

While the invention has been described in terms of preferred embodiments, it will be understood, of course, that the invention is not limited thereto since modifications may be made by those skilled in the art, particularly in light of the foregoing teachings.

What is claimed is:

1. A semiconductor device comprising:
    a germanium substrate having a first type of doping;
    a nucleation layer of group III–V materials disposed upon said germanium substrate, wherein the deposition of said nucleation layer also forms a germanium junction forming layer on a portion of said germanium substrate, said germanium junction forming layer being actively doped with a constituent element of said nucleation layer, said actively doped germanium junction forming layer having an opposite doping to said first type of doping;
    at least one layer of a group III–V semiconductor material adjacent to and disposed upon said nucleation layer;
    a first electrical contact formed on said germanium substrate; and
    a second electrical contact formed on one of said at least one layer of a group III–V semiconductor material;
    a third electrical contact formed on said one or another of said at least one layer, said third electrical contact electrically coupled to said second electrical contact to form a device, said device selected from the group consisting of a transistor, a resistor and a diode; and
    a fourth electrical contact formed on said one or another of said at least one layer of said group III–V semiconductor material, said fourth electrical contact electrically coupled to said second electrical contact to form a second device, said second device selected from the group consisting of a transistor, a resistor and a diode.

2. The semiconductor device of claim 1, wherein said constituent element is selected from the group consisting of Phosphorus, Arsenic, and a combination of Phosphorus and Arsenic.

3. The semiconductor device of claim 2, wherein said germanium junction forming layer also being actively doped with a second constituent element from said at least one layer of said group III–V semiconductor material.

4. The semiconductor device of claim 1, wherein said second constituent element is selected from the group consisting of Phosphorus, Arsenic, and a combination of Phosphorus and Arsenic.

5. The semiconductor device of claim 1, wherein the level of said first dopant is a function of a desired frequency operating range and photo-response characteristics of the semiconductor device.

6. The semiconductor device of claim 1, wherein said nucleation layer is lattice-matched to said germanium substrate.

7. The semiconductor device of claim 6, wherein said nucleation layer is an InGaP layer.

8. The semiconductor device of claim 1, further comprising coupling said first electrical contact with said second electrical contact to form an optoelectronic integrated circuit.

* * * * *